US00RE41862E

(19) United States
(12) Reissued Patent
Tiburtius et al.

(10) Patent Number: US RE41,862 E
(45) Date of Reissued Patent: Oct. 26, 2010

(54) METHOD FOR PRODUCING A SHIELDING CASE

(76) Inventors: Bernd Tiburtius, Rosenhag 10, D-14532 Kleinmachnow (DE); Helmut Kahl, Horstwalder Str. 23, D-12307, Berlin (DE)

(21) Appl. No.: 12/111,943

(22) PCT Filed: Mar. 5, 1998

(86) PCT No.: PCT/DE98/00682

§ 371 (c)(1),
(2), (4) Date: Nov. 12, 1999

(87) PCT Pub. No.: WO98/39957

PCT Pub. Date: Sep. 11, 1998

Related U.S. Patent Documents

Reissue of:
(64) Patent No.: 6,312,550
Issued: Nov. 6, 2001
Appl. No.: 09/380,691
Filed: Nov. 12, 1999

U.S. Applications:
(

(63) Continuation of application No. 10/702,054, filed on Nov. 5, 2003, now abandoned.

(30) Foreign Application Priority Data

Mar. 5, 1997 (DE) ..... 197 13 524

(51) Int. Cl.
*B05D 5/10* (2006.01)
*B05D 5/12* (2006.01)
*H05L 5/06* (2006.01)

(52) U.S. Cl. ..... 156/292; 156/244.22; 156/578

(58) Field of Classification Search ..... 156/244.11, 156/244.12, 244.22, 292, 108, 276, 500, 156/578; 174/35 R, 35 GC; 427/256, 284; 277/628, 629, 644, 650, 654, 936, 944, 939, 277/940, 941, 942; 428/343, 356
See application file for complete search history.

(56) References Cited

U.S. PATENT DOCUMENTS

| | | | |
|---|---|---|---|
| 4,098,633 | A | 7/1978 | Kersten |
| 4,968,854 | A | 11/1990 | Benn, Sr. et al. |
| 4,977,295 | A | 12/1990 | Chin et al. |
| 5,053,924 | A | 10/1991 | Kurgan |
| 5,447,761 | A | 9/1995 | Lafond |
| 5,571,991 | A | 11/1996 | Highum et al. |
| 5,731,541 | A | 3/1998 | Tiburtius et al. |
| 5,882,729 | A | 3/1999 | Kahl et al. |
| 6,096,413 | A | 8/2000 | Kalinoski et al. |
| 6,254,107 | B1 | 7/2001 | Neuhaus |
| 6,323,418 | B1 | 11/2001 | Tiburtius et al. |
| 6,670,545 | B2 | 12/2003 | Botrie |

FOREIGN PATENT DOCUMENTS

| | | | |
|---|---|---|---|
| CA | 2125742 | | 12/1994 |
| DE | 38 12 943 | A1 | 11/1989 |
| DE | 39 34 845 | A1 | 5/1990 |
| DE | 43 19 965 | A1 | 12/1994 |
| DE | 19733627 | | 6/1998 |
| DE | 10046557 | | 4/2002 |
| EP | 0 399 028 | B1 | 11/1990 |
| EP | 0 410 701 | A2 | 1/1991 |
| EP | 629114 | A1 * | 6/1994 |
| EP | 0 629 114 | A1 | 12/1994 |
| EP | 0 629 114 | B1 | 12/1994 |
| EP | 0 654 962 | A1 | 5/1995 |
| GB | 2 192 354 | A | 1/1988 |
| GB | 2 217 304 | | 10/1989 |
| GB | 2 224 604 | | 5/1990 |
| GB | 2 261 324 | A | 5/1993 |
| HU | 210 445 | B | 4/1995 |
| JP | 60-132171 | | 7/1985 |
| WO | WO91/15939 | | 10/1991 |
| WO | WO 97/26782 | | 7/1997 |
| WO | WO 01/71223 | | 9/2000 |

* cited by examiner

*Primary Examiner*—John L Goff
*Assistant Examiner*—Daniel McNally
(74) *Attorney, Agent, or Firm*—Christie, Parker & Hale, LLP

(57) ABSTRACT

Method of producing a shielding casing (4) in which there is provided a sealing and shielding profile section (9) which fills a gap between first and second adjoining casing portions (1, 2) and which comprising pasty material is applied under pressure from a coordinate-controlled applicator device (5) having an applicator needle or nozzle directly [on to] *onto* the first casing portion and then sets there elastically adhering thereto in self-supporting relationship, wherein the sealing and shielding profile section is produced by simultaneously applying at least one first material (8a) with material properties adapted for a good sealing action and a second material (8b) with material properties adapted to a good shielding action, from the applicator needle or nozzle (6) provided with at least a first and a second passage (6a, 6b), whereby the second material firmly adheres to the first material.

13 Claims, 2 Drawing Sheets

METHOD FOR PRODUCING A SHIELDING CASE

Matter enclosed in heavy brackets [ ] appears in the original patent but forms no part of this reissue specification; matter printed in italics indicates the additions made by reissue.

*The subject application is a Continuation Reissue application Ser. No. 12/111,943 filed Apr. 29, 2008 of U.S. Reissue patent application Ser. No. 10/702,054 ('054 Reissue Application) filed Nov. 5, 2003, which is a reissue application of U.S. Pat. No. 6,312,550 ('550 Patent) issued Nov. 6, 2001 and filed as a National Stage application of International Application PCT/DE98/00682 (PCT '682 application) claiming priority of DE 197 13 5242 filed Mar. 5, 1997.*

BACKGROUND OF THE INVENTION

Electrically shielding casings for accommodating and electromagnetically shielding units which emit electromagnetic radiation or which are sensitive to electromagnetic radiation have long been known.

While earlier such casings were usually made from metal for obvious reasons, with the onset of the spread thereof on a large scale—for example in relation to mobile telephones or cordless telephones—for cost and weight reasons there has been a change over to making them in particular from plastic material. The prefabricated, in particular injection-moulded casing portions are coated with a conductive material, for example by spraying on conductive lacquer, vapour deposition with aluminium or galvanisation.

Such casings were initially generally provided with prefabricated seals which comprise conductive elastomer and which were fitted upon assembly. DE 38 12 943 A1 shows an internally coated shielding casing of fibre-reinforced plastic material with a prefabricated seal of that kind which was inserted between a groove and a tongue.

Casings of the above-indicated kind are also known from EP 0 629 114 B1 and EP 0 654 962 A1.

The casings described therein are composed of two portions which for electrical shielding of the interior of the casing (at least in portion-wise manner) comprise elastically conductive material or are coated with same and in the assembled condition form a Faraday's cage For the purposes of electromagnetic shielding of the casing in the join region between the casing portions which come together, there is provided a shielding seal which comprises an electrically conductive and at the same time elastic material and which adapts to surface tolerances and irregularities so that a very high level of quality in terms of shielding the interior of the casing can be guaranteed even on a mass production scale. This shielding seal is produced directly on at least one of the casing portions while an additional carrier can also be incorporated into the structure.

By virtue of that configuration the casing can be opened for example for maintenance purposes or to replace a power source and then easily closed again while maintaining the sealing and shielding effect.

In production of a material for the shielding seal however it was found that it was difficult to arrive at an optimum compromise between high elasticity, high conductivity and lowest possible material costs. A material with an advantageously high shielding action is a plastic material which is filled with a high proportion of silver powder but this is relatively expensive and has only limitedly satisfactory mechanical properties DE39 34 845 A1 describes the production of a shielding casing with a two-layer shielding profile by the application of an elastic but non-conductive sealing profile to a casing portion and then spraying a conductive coating on to that sealing portion. This method basically makes it possible to save on material costs but it is technologically complicated and expensive and results in seals whose mechanical and in particular electromagnetic properties cannot be completely convincing.

The solution proposed in WO 97/26782 by the applicants also requires if the sealing profile is dispensed on to a casing portion—an additional method step and only makes it possible to produce relatively thin conductive coatings.

SUMMARY OF THE INVENTION

The object of the present invention is to provide a method of producing a shielding casing of the kind set forth in the opening part of this specification, which permits simple and inexpensive production of shielding casings with very good mechanical and electromagnetic properties and with a long service life.

The invention includes the technical teaching of forming the shielding profile section in a single application step from (at least) two different[.] elastically setting components which however are optimised in regard to different functions, in such a way that they are firmly and durably connected together and thus form a reliably dual-functional unit.

Insofar as expulsion from a needle or nozzle with at least a first and second duct or passage is provided as the sole application step, both components can be applied to the casing at a high process speed in a thickness which is adequate for an excellent sealing and shielding effect. As the surfaces of both components, in the initial condition, that is to say before the onset of any cross-linking or hardening are brought into contact with each other, they cross-link to each other or a diffusion interface is formed, which guarantees a practically non-releasable connection between the two profile sections.

The profile portion or section formed from the first material primarily involves the function of filling the gap space in order in spite of mechanical play in respect of the casing portions, which is caused by production tolerances or surface irregularities, to reliably protect the interior of the casing from moisture and dust and possibly prevent relative movements between the casing portions. By virtue of the mechanically optimised properties of the first material it is possible for the internal space in the casing to be durably hermetically sealed off. At the same time the first profile section is naturally a carrier for a section of the electromagnetic shielding and ensures the closure integrity thereof. In regard thereto it is particularly advantageous to adopt a material with a high level of elasticity and/or a configuration for the seal which affords elasticity in respect of shape, on the basis of which upon assembly of the casing portions compression and/or flexion of the sealing element affords a prestressing effect as between the casing portions which for example can prevent a screw or clamping connection from coming loose.

In an advantageous alternative of the invention it is provided that the second material used is a plastic material of the same kind as the first material, with the second material being made conductive by virtue of electrically conductive inclusions. The substantial material uniformity achieved in that way serves to consolidate the above-discussed effect Production of the shielding profile section is advantageously technologically simplified and rendered less expensive by virtue of the use of a plastic material which hardens in air and at ambient temperature and which in particular has thixotropic properties, more specifically on a silicone basis, but alternatively it is also possible to use heat-hardening or radiation-crosslinking material.

To achieve a shielding effect which satisfies the high test requirements involved, the electrically conductive inclusions added are especially particles comprising a metal or an alloy with a high level of electrical conductivity, in particular silver or a silver-bearing alloy. What is less expensive is the use of a silver-coated powder comprising another metal (nickel, copper or the like) or non-conducting carrier particles (for example of glass). The metal content is typically over 25% by mass, or to achieve very high shielding effects in relation to mobile telephones etc possibly even markedly over 50% by mass, with respect to the mass of the silicone-metal mix.

Besides metal powder, it is also possible in particular to use short metal fibres or metal flakes which in the plastic matrix, if their dimensions are suitably adapted to match the properties of the matrix material and the method characteristics, can advantageously form a kind of metal lattice structure This can impart to the conductive profile portion a high level of conductivity with a relatively small proportion of metal and in conjunction therewith can at the same time afford advantages in terms of relatively low hardness and brittleness.

For situations of use in which adaptation of the degrees of hardness of the first and second materials is desired, it is possible to add to the first material a non-conductive filler, in particular an inexpensive oxidic or ceramic powder ($SiO_2$, silicates or the like).

Depending on the specific material properties of the casing surface, to which the sealing and shielding profile section is applied, a bonding agent or primer can be used to increase the adhesion capability thereto when applying the first and/or second material. The bonding agent can be added in particular to the material; alternatively however it can be applied beforehand, for example in the course of surface treatment of the casing portions In the production of casings in which the possibility of opening and re-closing is to be provided, the second casing portion is preferably only brought into contact with the sealing and shielding profile section after substantially total hardening or setting of the first and/or second material. As a result, no adhesion to the second casing portion occurs, and there is a very high level of shape and functional resistance on the part of the profile section even when the shielding casing is opened and re-closed a plurality of times.

For the purposes of forming preferred profile shapes, application of the sealing and shielding profile section involves the use of an applicator needle/nozzle in which the first passage is surrounded by the second passage, at least over a portion of the periphery of the first passage—in the simplest case, completely. More especially, it is possible to use an applicator needle or nozzle whose first passage is of substantially circular cross-section and is concentrically surrounded by the second passage, wherein the latter is of a cross-section that is substantially in the form of a segment of a circular ring.

The needle shape and cross-section, in an embodiment which is to be preferred for many uses, are so selected that the second material is applied in the profile cross-section, in an irregular thickness. In particular the second material can be applied on the inside of the casing in a larger thickness than in the portion which is towards the casing portion and/or on the outside of the casing, whereby it is possible to implement a seal which tends to be 'softer'. By applying the second material only to the inside of the profile section it is possible for example to counter problems which can arise out of possible corrosion of the metal filling of the second material, especially in extreme sectors of use (in the tropics, in connection with shipping on the high seas etc).

In a further alternative configuration of the invention the shielding profile section can be constructed by simultaneous application of three strands of material in sandwich structure from a triple-passage needle insofar as two strands of material of the mechanically optimised type ('first material') are applied and between them a strand of elastically conductive material which produces the electromagnetic shielding effect. The arrangement of the profile portion consisting of electrically conductive material in a substantially deformation-free region between two deformable layers or strands of the elastic material advantageously counteracts crack formation in the electrically conductive material, which is of significance more especially in relation to constructions in which severe deformation of the shielding element can occur when assembling the casing portions. This arrangement is also particularly resistant to corrosion.

To obtain a starting material which is suitable for the method, it is possible to add a long-chain, non-crosslinking siloxane to a cross-linkable silicone rubber which hardens by the cross-linking effect, forming a gel-like state. The sealing and shielding profile section formed from such a mixture is distinguished by a high level of adhesive strength on the support to which it is applied and a Shore A hardness which can be set to low values and a high possible degree of deformation. Relatively soft but nonetheless mechanically sufficiently resistant EMI-shielding profile sections can be produced with materials which contain about 5% by mass of bifunctional non-crosslinked siloxane, for example (poly-) dimethylsiloxane with methyl or hydroxyl terminal groups, of a viscosity in the range of between 10 and $10^3$ mPa.s. In a development which is advantageous for certain uses, it is also possible to provide a silicone resin component in the sealing material, preferably a proportion of over 3% by mass of a solution of a commercially available, heat-hardening or radiation-hardening resin component.

The degree of deformation of an approximately U-shaped two-component sealing and shielding profile section of solid material can be (relative to the height of the unloaded profile section) 30% or more, and for certain uses preferably up to over 50%. By virtue of special profile cross-sectional configurations, for example the adoption of a lip profile which is at the same time compressible and flexurally deformable, it is possible to additionally deliberately and specifically influence an effective degree of deformation and elastic return force of the profile section. The specified method steps and possibly additional geometrical measures make it possible to reliably shieldingly seal even gaps of a width which differs considerably over the longitudinal extent thereof. This permits greater tolerances in the prefabrication of the casing portions, in such a way as to reduce costs.

BRIEF DESCRIPTION OF THE DRAWINGS

Advantageous developments of the invention are set forth in greater detail hereinafter together with the description of preferred embodiments with reference to the Figures in which.

DETAILED DESCRIPTION

Figure 1:
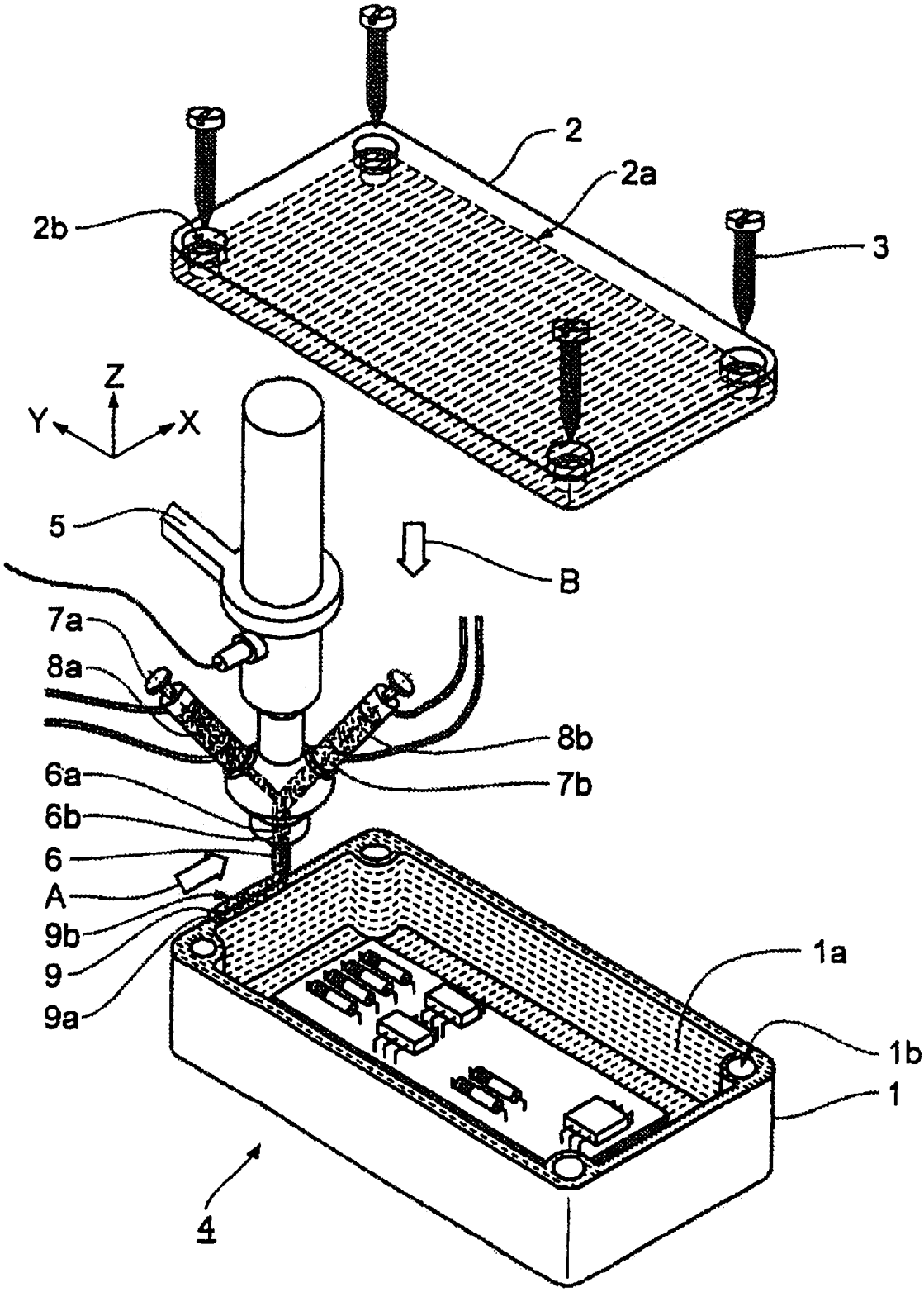
FIG. 1 is a view showing the principle of the way in which the invention is carried into effect.

FIG. 1 is a diagrammatic view showing the principle of a casing bottom portion 1 and a casing cover 2 of injection-moulded plastic material for an electronic device (in practice for example a mobile telephone), which are both provided with an inside metallisation layer 1a and 2a respectively. Formed in both casing portions 1, 2 are screw holes 1b and 2b respectively. [w] *W*herein the screw holes 1b in the casing bottom portion are provided for partially self-tappingly screwing in self-tapping screws 3 while the screw holes 2b in the cover each have a countersink for accommodating the screw head of the respective screws 3. This screw connection permits the device casing 4 to be opened and re-closed repeatedly if required.

The Figure diagrammatically shows the way in which an arm 5 of a coordinate-controlled handling device (not shown overall as such) guides an applicator needle 6 having two concentrically extending passages or ducts 6a, 6b, with hose connections 7a, 7b for feeding two seal starting materials 8a, 8b which are under pressure, in the direction of the arrow A, over the edge section of the casing bottom portion 1. In that operation, an approximately U-shaped sealing and shielding material strand 9 whose core 9a comprises the first starting material 8a and whose surface layer 9b comprises the second starting material 8b is distributed on to the edge section and firmly adheres there.

The first starting material 8a is an unfilled silicone mixture which is set to a pasty-gel-like condition and which hardens in air and at ambient temperature while the second starting material 8b is a silicone conductive mixture which is set to a pasty condition and which is filled with a proportion of about 50% by mass of silvered nickel particles, the matrix of the silicone conductive mixture being of substantially the same composition as the first material 8a to which however a surface active agent is additionally added as a bonding agent or primer, in a proportion of less than 1% by mass.

After issuing from the needle 6 hardening of the material strand 9 begins immediately from the surface—without additional technical measures—to constitute an elastic, freely formed sealing and shielding profile section having a soft core and a highly conductive but also still relatively elastic surface layer which encases the core on all sides. After hardening is substantially concluded, the cover 2 is fitted on to the bottom portion 1—as symbolically indicated by the arrow B—and screwed to the bottom portion 1 by way of the screws 3, in which case the material strand 9 which has hardened to form the sealing and shielding profile section is elastically deformed without adhering to the cover 2 and reliably seals and shields the gap between the casing portions 1, 2.

FIGS. 2a to 2j are cross-sectional views showing various sealing and shielding profile sections in accordance with preferred embodiments together with the applicator needles which are respectively used for the production thereof. The finished profile sections are each shown with parts of the adjacent casing surfaces 1' and 2 respectively, wherein reference 1' (unlike the specification relating to FIG. 1) stands for a metal casing bottom portion while the material adopted for the cover 2 is again plastic material with a metal coating 2a. (It will be appreciated that the invention can also be applied in relation to an entirely metal casing.)

Figure 2A:
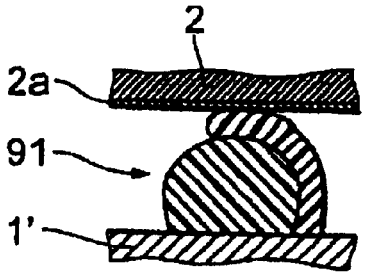
FIGS. 2a to 2j are diagrammatic cross-sectional views of sealing and is shielding profile sections in accordance with preferred embodiments and the applicator needles respectively used for the production thereof.
Figure 2B:
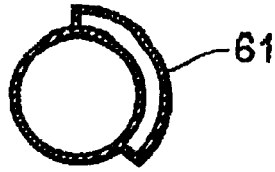

The sealing and shielding profile section 91 shown in FIG. 2a comprises a non-conductive base portion 91a and a conductive layer 91b which covers the base portion 91a over rather more than half the periphery thereof, and it is applied to the casing portion 1' by means of an applicator needle 61 diagrammatically shown in FIG. 2b, having a first duct or passage 61a of circular cross-section and a second duct or passage 61b, which partially surrounds it, of a cross-section which is in the form of a segment of a circular ring.

Figure 2C:
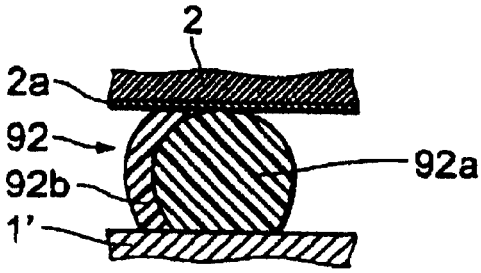
Figure 2D:
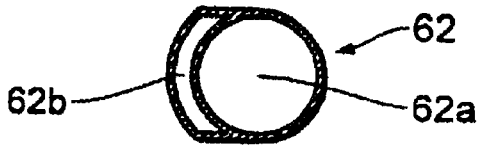

The sealing and shielding profile section 92 shown in FIG. 2c comprises a non-conductive base portion 92a and a conductive flank portion 92b which extends around same over somewhat less than half the periphery thereof, and is applied to the casing portion 1' by means of an applicator needle 62 shown in FIG. 2d, having a first duct or passage 62a of circular cross-section and a second duct or passage 62b which partially surrounds it, of a cross-section which is approximately in the shape of a segment of a circular ring The sealing and shielding profile section 93 shown in FIG. 2c differs from that shown in FIG. 2c in that provided on both sides of a non-conductive base portion 93a is a respective conductive profile portion 93b, 93c which extends over rather less than half the periphery thereof The profile section 93 is produced by means of an applicator needle 63 as shown in FIG. 2d, with a first duct or passage 63a of circular cross-section and two ducts or passages 63b, 63c which are arranged laterally thereof and which are of a cross-section that is approximately in the form of a segment of a circular ring.

Figure 2E:
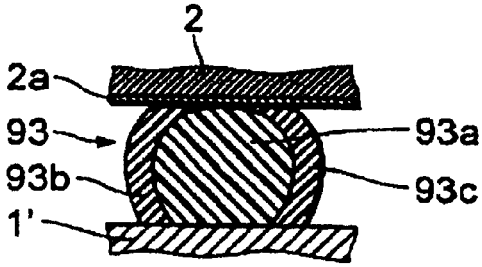
Figure 2F:
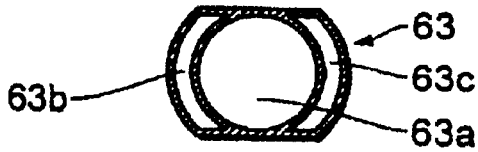
Figure 2G:
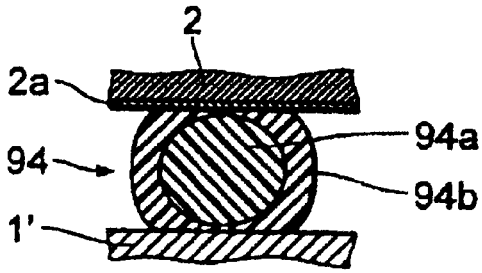
Figure 2H:
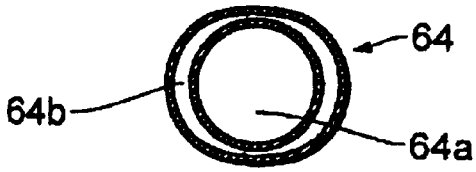
Figure 2I:
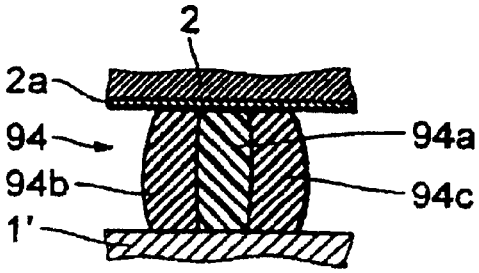
Figure 2J:
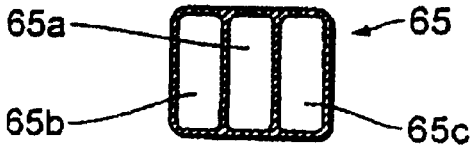

In the case of the sealing and shielding profile section 94 shown in FIG. 2g, a non-conductive core portion 94a is completely encased by a conductive layer 94b whose thickness however is smaller in the gap space in the proximity to the casing portions 1', 2. This profile section is formed by means of an applicator needle 64 diagrammatically shown in FIG. 2h, having a first duct or passage 64a of circular cross-section and a second duct or passage 64b surrounding it, of ellipsoidal cross-section.

The sealing and shielding profile section 95 shown in FIG. [21] *2i* is of a similar (three-component) structure to that shown in FIG. 2e, but the association of material is different: provided on each side of a conductive, shielding central portion 95a is a respective non-conductive, sealing profile portion 95b, 95c. The profile section 95 is produced by means of an applicator needle 65 as shown in FIG. 2d, with three ducts or passages 65a to 65c which are arranged in side-by-side relationship and which are of approximately rectangular cross-section.

The invention is not limited in terms of its implementation to the preferred embodiments described hereinbefore. On the contrary, it is possible to involve a number of variants which make use of the illustrated solution even in configurations of a different nature.

Thus the specification of the first material as being 'non-conductive' is to be understood in the broad sense as meaning that this material is of markedly lower conductivity (for example corresponding to a markedly lower level of metallic filling) than the second material. The use of a plastic material on a silicone basis is not a necessary feature; it is also possible to use a neoprene or other elastically setting material which also does not necessarily have to harden at ambient temperature.

The geometry of the profile section to be produced and the needle and nozzle cross-sectional shape which is to be adopted in relation thereto depend on the purpose of use and the specific configuration of the shielding casing and, besides the variants diagrammatically illustrated in FIGS. 2a to 2j, many others can also be used.

What is claimed is:

1. A method of producing a shielding casing for mechanically protecting and electromagnetically shielding an electronic functional unit, in which there is provided a sealing and shielding profile section which fills *a* gap between [a] first and second adjoining casing portions and which comprises pasty material applied under pressure from a coordinate-controlled applicator needle or nozzle directly [on to] *onto* the first casing portion which then sets elastically, adhering thereto in self-supporting relationship, comprising: producing the sealing and shielding profile section by simultaneously applying at least a first material *which sets elastically,* with material properties which are adapted to a good [shielding] *sealing* action, and a second material, [which sets elastically,] with material properties which are adapted to a good [sealing] *shielding* action, from the applicator needle or nozzle which is provided with at least a first and a second passage, whereby the second material adheres firmly to the first material and wherein one of the first and second materials forms a base portion and the other of the first and second materials forms a layer that at least partially surrounds the base portion.

2. The method of claim 1, wherein the second casing portion is brought into contact with the sealing and shielding profile section after substantially complete hardening of the first and/or second material.

3. The method of claim 1, wherein the first material used is a substantially non-conductive plastic material which hardens in air and at ambient temperature and the second material used is a plastic material which is made conductive by means of electrically conducting inclusions, the second plastic material being of the same kind of material as the first material.

4. The method of claim 3, wherein particles comprising a metal or an alloy with a high level of electrical conductivity are used as electrically conducting inclusions.

5. The method of claim 3, wherein the first material contains a non-conductive filler.

6. The method of claim 1, wherein a bonding agent is used when applying the first and/or second material.

7. The method of claim 1, wherein the first passage of the applicator needle or nozzle is surrounded at least over a part of its periphery by the second passage.

8. The method of claim 1, wherein application of the sealing and shielding profile section is effected by using an applicator needle or nozzle whose first passage is of substantially circular cross-section and is concentrically surrounded at least in portion-wise manner by the second passage, wherein the latter is of a cross-section that is substantially in the form of a segment of a circular ring.

9. The method of claim 1, wherein the second material is applied in the profile cross-section with irregular thickness.

10. The method of claim 9, wherein the second material is applied on the inside of the casing with a greater thickness than in the part towards a casing portion and/or on the outside of the casing.

11. The method of claim 3, wherein the non-conductive plastic material is made of silicone and has thixotropic properties.

12. The method of claim 4, wherein the particles are fibres or flakes of silver or silver-bearing alloy.

13. The method of claim 5, wherein the non-conductive filler is oxidic or ceramic.

* * * * *